United States Patent
Smayling et al.

(10) Patent No.: US 7,332,360 B2
(45) Date of Patent: Feb. 19, 2008

(54) EARLY DETECTION OF METAL WIRING RELIABILITY USING A NOISE SPECTRUM

(75) Inventors: Michael C. Smayling, Sunnyvale, CA (US); Dennis J. Yost, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 364 days.

(21) Appl. No.: 10/973,552

(22) Filed: Oct. 25, 2004

(65) Prior Publication Data

US 2006/0088949 A1    Apr. 27, 2006

(51) Int. Cl.
G01R 31/26    (2006.01)
H01L 21/66    (2006.01)

(52) U.S. Cl. .............. 438/14; 438/17; 438/18; 324/71; 324/765; 257/E21.521; 257/E23.179

(58) Field of Classification Search .......... 438/14, 438/18; 324/765; 257/48
See application file for complete search history.

(56) References Cited

U.S. PATENT DOCUMENTS

| | | | |
|---|---|---|---|
| 5,049,811 A | | 9/1991 | Dreyer |
| 5,057,441 A | * | 10/1991 | Gutt et al. ............... 438/11 |
| 5,434,385 A | | 7/1995 | Biery |
| 5,514,974 A | | 5/1996 | Bouldin |
| 5,563,517 A | | 10/1996 | Biery |
| 5,798,649 A | | 8/1998 | Smayling |
| 5,804,975 A | | 9/1998 | Alers |
| 5,970,429 A | | 10/1999 | Martin |
| 6,043,662 A | | 3/2000 | Alers |
| 6,603,321 B2 | | 8/2003 | Filippi |
| 6,747,471 B1 | | 6/2004 | Chen |
| 2003/0147126 A1 | * | 8/2003 | Rapp ................ 359/341.41 |
| 2004/0253754 A1 | * | 12/2004 | Zhuang et al. ............ 438/18 |

OTHER PUBLICATIONS

S.V. Nguyen [High-density plasma chemical vapor deposition of silicon-based dielectric films for integrated circuits, IBM Journal of Research and Development, vol. 43, 1/2, 1999].*

* cited by examiner

*Primary Examiner*—Michael Lebentritt
*Assistant Examiner*—Abdulfattah Mustapha
(74) *Attorney, Agent, or Firm*—Patterson & Sheridan, LLP

(57) ABSTRACT

The present invention generally provides an apparatus and a method for inspecting a substrate in a substrate processing system. In one aspect, a voltage or current source is used in conjunction with a power density receiving device, such as a spectrometer, to inspect a substrate for various noise spectrum signatures. In one embodiment, spectral data collected from a given substrate is used to generate a current or voltage spectral signature. This spectral signature may then be compared to a reference spectral density signature to predict reliability of a feature structure of a substrate in processing and feedback to the substrate processing system for substrate processing control. Embodiments of the invention further include computer-readable media containing instructions for controlling the substrate processing system, and computer program products having computer-readable program code embodied therein for controlling the substrate processing system and inspecting defects on semiconductor features.

23 Claims, 10 Drawing Sheets

EARLY DETECTION OF METAL WIRING RELIABILITY USING A NOISE SPECTRUM

BACKGROUND OF THE INVENTION

1. Field of the Invention

Embodiments of the present invention generally relate to a method and apparatus for reliable processing of a semiconductor substrate without any defects thereon. More particularly, this invention relates to inspection of a semiconductor substrate during manufacturing of high-density semiconductor devices with submicron features.

2. Description of the Related Art

Current demands for high performance associated with very large scale integration (VLSI) and ultra large scale integration (ULSI) require smaller submicron feature sizes, faster speeds, denser components and improved reliability. Fabrication of integrated circuits (IC) having multiple levels of patterned metallization lines and interconnects which are separated from one another by interlayer dielectrics to form features, e.g., vias, trenches, holes, plugs, wires, lines, contacts, dies and, studs, etc., are prone to include defects thereon. For example, electromigration along a metal conductor during metal wiring may cause thinning or thickening of the conductor resulting in void and hillock formation, respectively, as well as damage to metallization lines and interconnects. Formation of various integrated circuits structures and device features with high precision and uniformity necessitates careful inspection to assure the reliability and functionality of the integrated circuits. However, the inspection equipment needed has become ever more complex and expensive.

Various inspection techniques for detecting defects include scanning electron microscopy (SEM) on semiconductor surfaces and cross sections, and thermal measurement analysis of a semiconductor die with lasers. However, these techniques are destructive to the features formed on a semiconductor substrate, time-consuming to perform, and thus may not be suitable during semiconductor manufacturing for defect detection.

Conventionally, metal wiring reliability is tested after the IC devices are fabricated (wafer-level testing) or packaged (packaging-level testing). Various reliability tests and burn-in scheduling tests, such as median time to failure (MTF) test, temperature ramp resistance analysis to characterize electromigration (TRACE), and various package-level and wafer-level electromigration acceleration tests, can be used to detect malfunctions or complete failure of the manufactured integrated circuits. These electromigration (EM) tests generally subject tested samples to relatively high stresses, such as forcing constant high current or high temperature to the tested samples, which are very destructive and are very time-consuming to perform, typically on the order of several hours to days or weeks, in order to predict a time that the tested samples will fail by extrapolating obtained information into years. In addition, the unique structures utilized on wafer-level testing to evaluate the result of stress can also cause failure of the IC. Further, the test structures occupy very small size between dies or vias which may have low defect density, thus are not sensitive enough to represent defect density prior to costly and time-consuming burn-in schedules of the integrated circuits.

Other conventional reliability tests which are relatively quick and non-destructive are based on noise measurement, e.g., correlating the occurrence of electromigration and stress voiding under aluminum wire or tungsten vias. Metal wiring reliability using a noise spectrum is generally limited to packaged ICs and has not yet been implemented during processing of thin film deposition or planarization prior to fabricating integrated circuits and packaging into integrated circuit devices. Also, noise measurement on copper wire structures was not successful, partly due to the presence of interface void formation between materials of poor adhesion with each other on a small device active area. In addition, direct application of electrical probes on the ever small semiconductor structures during manufacturing are prone to errors caused by background noise.

Therefore, there is a need for inspection of a semiconductor substrate while it is still inside a substrate processing system to look at reliability and quality of features formed on the semiconductor substrate before costly and time-consuming testing on fabricated and/or packaged integrated circuits.

SUMMARY OF THE INVENTION

Embodiments of the invention generally provide a method and apparatus for inspecting a substrate in a substrate processing system. In one embodiment, a method for determining the reliability of one or more features having one or more metal materials formed on a substrate includes placing the substrate in a substrate processing system, measuring a noise spectrum of a process variable affecting the processing of the substrate while the substrate is inside the substrate processing system, comparing the noise spectrum of the process variable for the one or more features having the one or more metal materials thereon to a reference noise spectrum, and determining the reliability of the one or more features on the substrate. The process variable may include a bias applied to the substrate, a plasma applied to the substrate processing system, a current applied to the substrate processing system, an electroplating current, etc., such as a plasma current, a plasma voltage, a plasma bias current, a plating current, among others.

In another embodiment, a method for determining the reliability of one or more copper wire features formed on a substrate is provided. The method includes measuring a noise spectrum of the one or more copper wire features after the substrate is processed by a substrate processing system and before the substrate is packaged into integrated circuit devices, comparing the noise spectrum of the one or more copper wire features to a reference noise spectrum, and determining the reliability of the one or more copper wire features on the substrate.

In still another embodiment, a method for determining the reliability of one or more features having one or more metal materials formed on a substrate includes placing the substrate in an electroplating processing system, measuring an electroplating current spectrum of the one or more features while the substrate is inside the electroplating processing system, comparing the electroplating current spectrum of the one or more features having the one or more metal materials thereon to a reference electroplating current spectrum, and determining the reliability of the one or more features on the substrate.

Another embodiment of the invention includes a semiconductor substrate processing system for processing a substrate. The semiconductor substrate processing system includes one or more substrate processing units adapted to process the substrate and form one or more features having one or more material layers thereon, and one or more substrate inspection units connected to the one or more substrate processing units and adapted to measure a noise spectrum of the one or more features and determine the reliability of the one or more features on the substrate. Further, the one or more substrate inspection units include one or more ammeters or one or more spectrum analyzers.

Yet another embodiment of the invention includes a computer-readable medium for determining the reliability of one or more features having one or more materials formed on a substrate, including instructions configured to control a substrate processing system, monitor the substrate processed by the substrate processing system, and perform one or more steps. In one aspect, the one or more steps include measuring a noise spectrum of a process variable affecting the processing of the substrate while the substrate is inside the substrate processing system, comparing the noise spectrum of the process variable for the one or more features to a reference noise spectrum, and determining the reliability of the one or more features on the substrate. In another aspect, the one or more steps include measuring a noise spectrum of the one or more features after the substrate is processed by the substrate processing system, comparing the noise spectrum of the one or more features having the one or more materials thereon to a reference noise spectrum, and determining the reliability of the one or more features on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to a method and apparatus for monitoring and inspecting defects formed during processing of a semiconductor substrate by exploiting the quality of features formed on the semiconductor substrate at early time in order to predict reliability of the features which are later fabricated and packaged into integrated circuits or devices. Further, the reliability of various features on a substrate are predicted from a noise spectrum, at the time of deposition, sputtering, planarization, and/or processing the substrate, by a monitoring/inspection module coupled to a substrate processing system, such as at time zero of integrated circuits or devices, i.e., before forming and packaging into semiconductor integrated circuits or devices.

One aspect of the invention includes detection of reliability characteristics of a single level or multiple level metal interconnect semiconductor structure. The interconnect semiconductor structure can be formed by single damascene or dual damascene processes, known in the art. Increasing chip density necessitates more components and less area available for surface wiring, resulting in the requirement of two or more metal wiring levels in IC devices.

Figure 1:
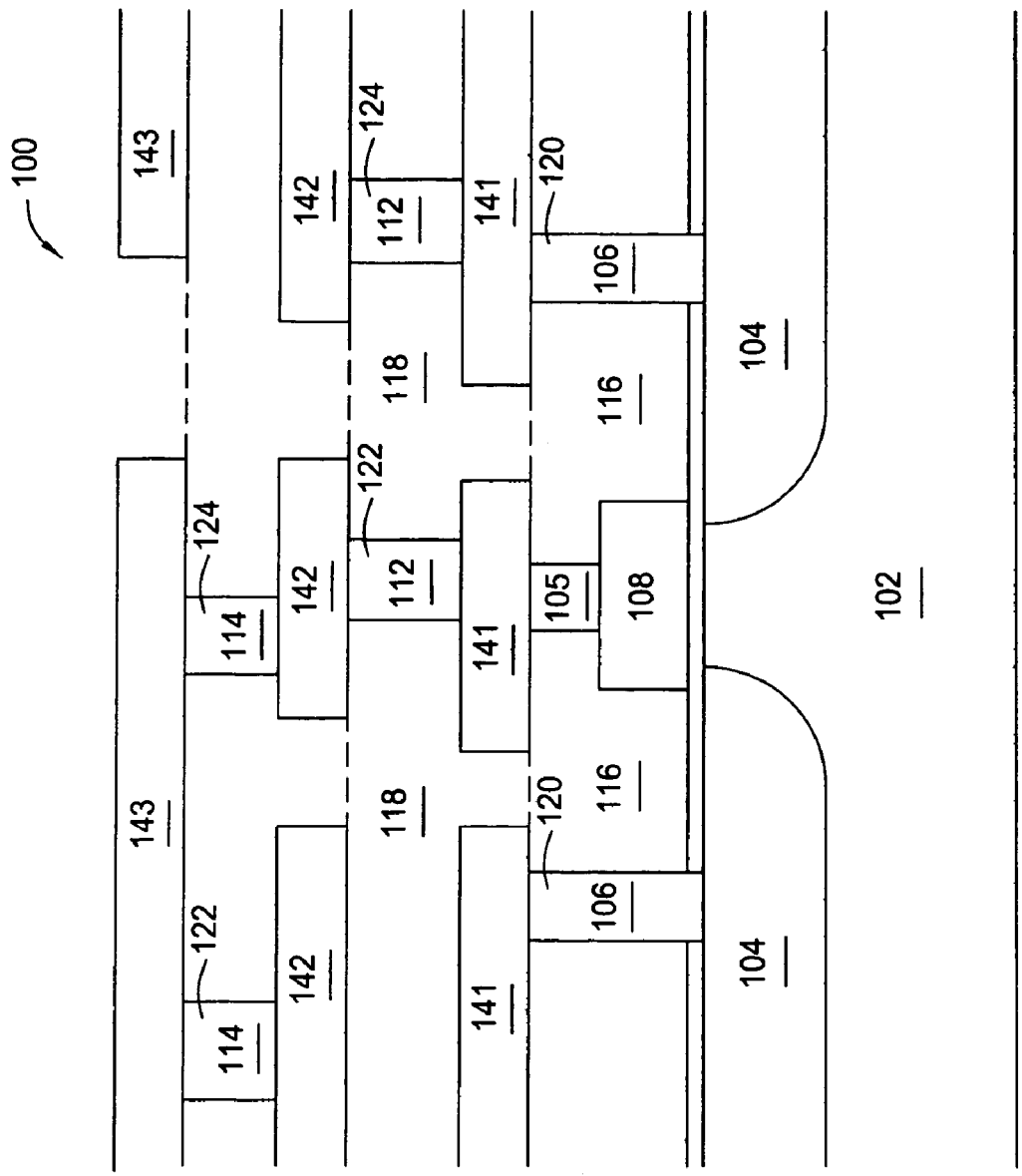
FIG. 1 is a cross sectional view of a multi-level semiconductor metal interconnect structure showing various semiconductor structures and features formed on a semiconductor substrate surface according to one embodiment of the invention.

FIG. 1 illustrates a cross sectional view of a multi-level semiconductor metal interconnect structure 100 showing various semiconductor structures and features formed on a semiconductor substrate surface 102, such as a silicon surface, to benefit from the method and apparatus of the invention. The semiconductor substrate surface 102 can include a source or drain 104 with a metal plug 120 or a gate electrode 108 thereon. The metal plug 120 may be filled by a metal material 106 therein and the gate electrode 108 may be filled by a dielectric material and/or a polysilicon material therein. Also, the gate electrode 108 may have a metal material 105 deposited on top.

The semiconductor substrate surface 102 may include one or more structures or features, such as a contact, a trench, a hole 122, a via 124 in order to form a metal wire, a metal line, a metal interconnect, and other semiconductor structures. The hole 122 and the via 124 may have a metal material 112 filled therein and between a first level metal material 141 and a second level metal material 142. Further, the hole 122 and the via 124 may have a metal material 114 filled therein and between a second level metal material 142 and a third level metal material 143.

The multiple level metal interconnect semiconductor structure 100 may include, for example, a first-layer metal line filled by the first layer metal material 141 therein, a second-layer metal line filled by the second layer metal material 142, and a third-layer metal line filled by the third layer metal material 143, connected to form various semiconductor features, metal wires, metal lines, metal interconnects, and other semiconductor structures on the substrate surface 202. The semiconductor structures/features 120, 122, and 124 may include, but are not limited to, vias, trenches, holes, plugs, wires, lines, contacts, dies, studs, and combinations thereof. The metal materials 105, 106, 112, 114, 141, 142, and 143 may include any of the metals suitable for semiconductor structures, for example, copper, tungsten, aluminum, their alloy metals, and combinations thereof.

Additionally, the semiconductor substrate surface 102 further includes various dielectric materials deposited and patterned thereon, such as a dielectric material 116 (e.g., pre-metal dielectric material, PMD) and an intermetallic dielectric material (IMD) 118. The dielectric material 116 may be phosphosilicate glass (PSG), among others, and the intermetallic dielectric material 118 may be low-κ dielectric materials, among others, such as fluorosilicate glass (FSG) or Black Diamond low-κ dielectric, available from Applied Materials, Inc., Santa Clara, Calif.

Embodiments of the invention explore the quality of a semiconductor line or wire structure on a substrate surface, while the substrate is inside a substrate processing system or right after the substrate is processed by the substrate processing system by looking at continuity and resistance of the semiconductor line or wire structure having a feature, (e.g., via, contact, etc.) therein. Thus, reliability and quality of the semiconductor line or wire structure, such as a copper wire or a copper line, at later time, e.g., years later, can be predicted. Accordingly, the reliability issue of a metal line or wire structure can be monitored in-situ and/or very early during substrate processing (at time zero).

Figure 2:
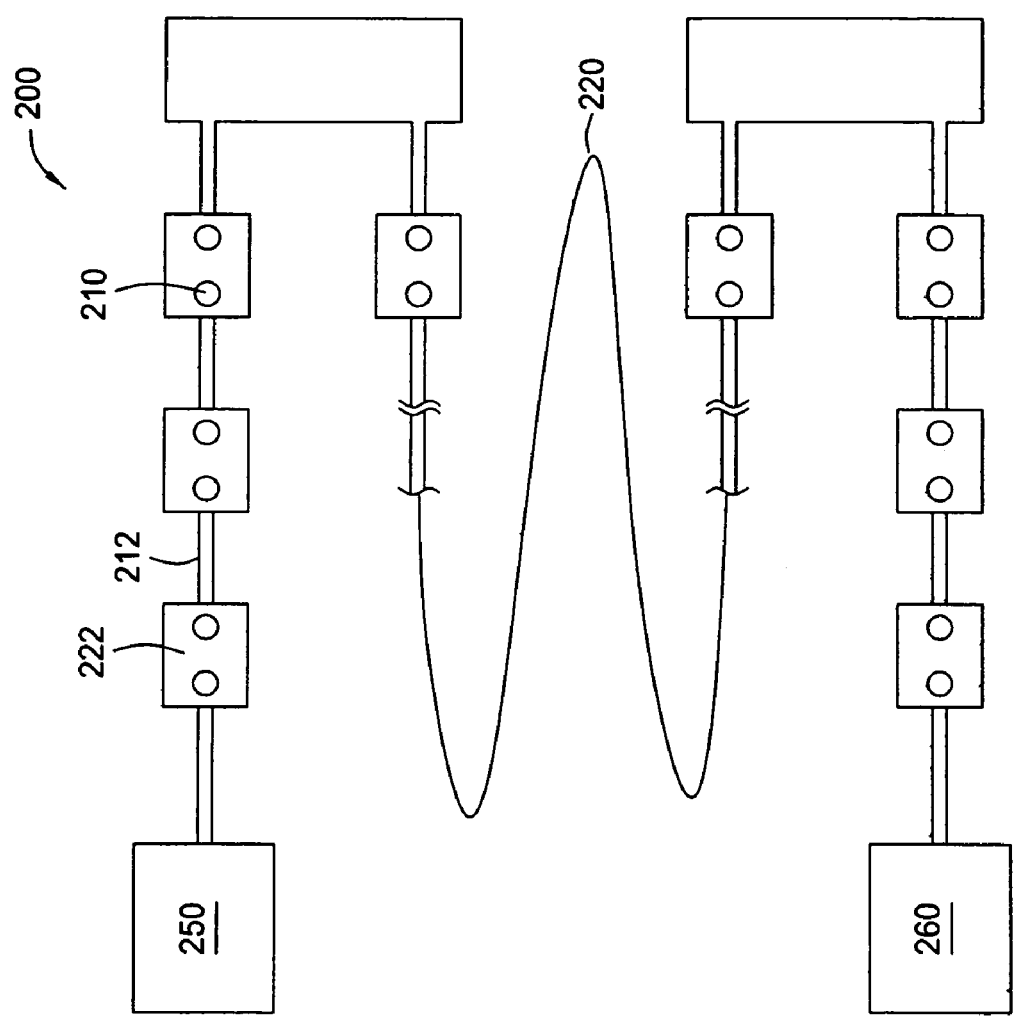
FIG. 2 demonstrates one example of a top view of a test structure on a substrate according to another embodiment of the invention.

FIG. 2 demonstrates one example of a top view of a test structure 200 for inspecting the reliability of a semiconductor line or wire structure 220 and detecting any defect formed on a substrate, after the substrate is processed by the substrate processing system and the semiconductor line or wire structure 220 is formed, according to one embodiment of the invention. The test structure 200 of the invention may include pad structures 250, 260, connected to the line or wire structure 220, such as a metal interconnect semiconductor structure. The line or wire structure 220 may include a lower level metal layer 212 and an upper level metal layer 222, connected by a semiconductor structure/feature 210. The semiconductor structure/feature 210 may include, but are not limited to, vias, trenches, holes, plugs, wires, lines, contacts, and combinations thereof.

In a reliable test structure 200, current or voltage flowing through the test structure 200 is generally smooth without much disturbance. However, in an unreliable test structure having defects (e.g., voids, holes, hillocks, discontinuities, contaminations, etc.) therein, current or voltage flowing through the line or wire structure 220 may be disturbed or discontinued resulting in an increase in noise spectral density which can be observed as spikes in a noise spectrum. Such unreliable structure will fail when fabricated into integrated circuits, if not detected earlier during processing of various lower or upper metal layers 212, 222 on a substrate.

In FIG. 2, pad structures 250, 260 are used as contacting or bonding probes for testing a noise spectrum of the test structure 200. Pad structures 250, 260 can have a size of about 100 microns×100 microns or smaller, such as about 80 microns×80 microns or smaller, to induce a current or voltage on the test structure 200 and receive a measurement of the resulting voltage or current density. Pad structures 250, 260 can also be connected to various resisters, ammeters, noise amplifiers, spectrometers, or spectrum analyzers to measure any increase in noise power density, according to embodiments of the invention. For example, a spectrum analyzer can transform the noise power density measurements through an algorithm, such as a Fourier Transform algorithm, into a noise spectrum.

Figure 3:
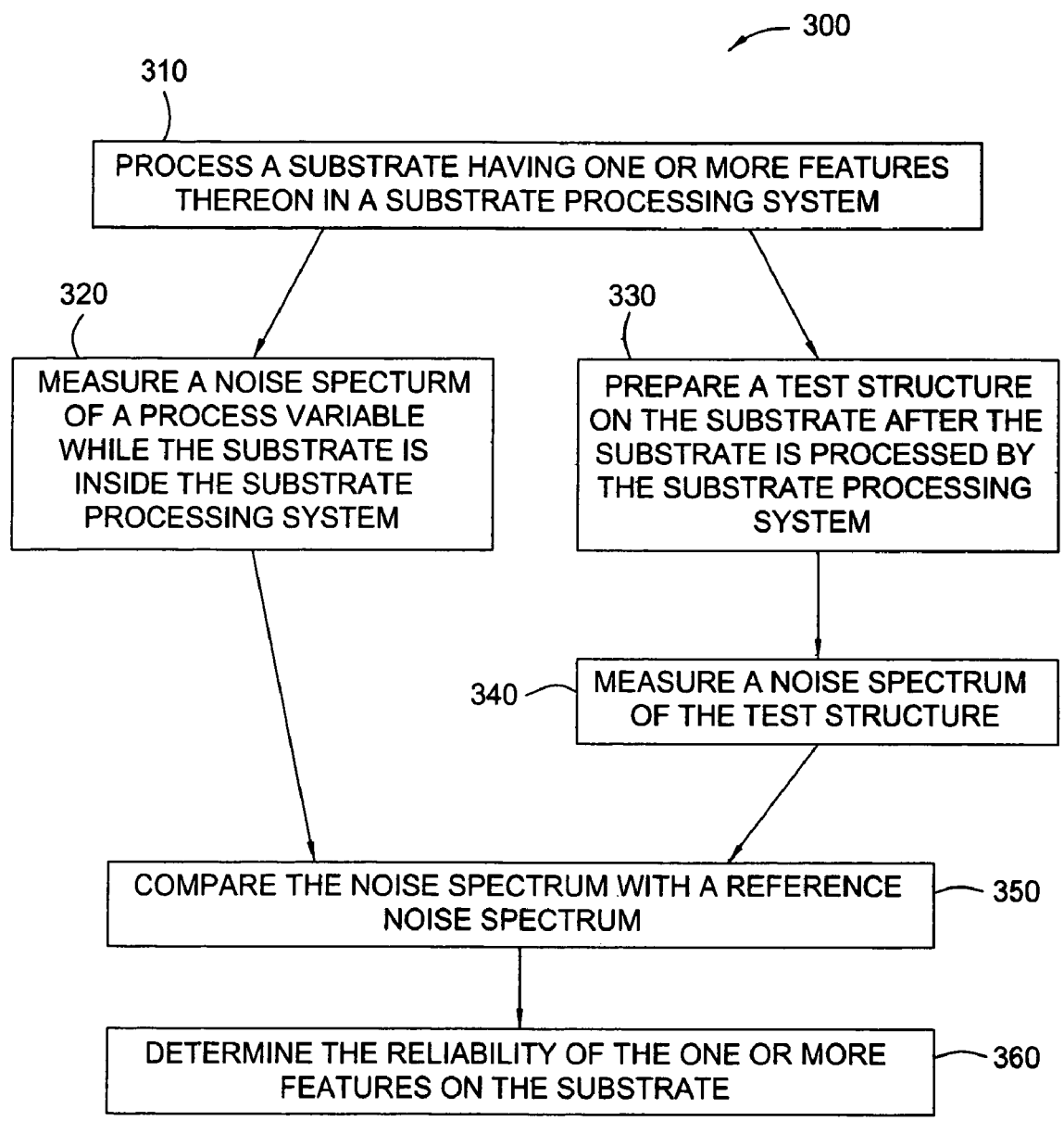
FIG. 3 is a flow chart showing embodiments of a method of the invention.

FIG. 3 is a flow chart showing embodiments of a method 300 of the invention for determining the reliability of a metal wire structure or a metal line structure, having one or more semiconductor features and one or more material layers formed thereon. In one embodiment, the method 300 includes measuring a noise spectrum of the semiconductor feature on a substrate while the substrate is inside a substrate processing system. In another embodiment, the method 300 includes measuring a noise spectrum of the semiconductor feature on a substrate after the substrate is processed by the substrate processing system.

At step 310, the substrate is placed inside the substrate processing system for processing and forming one or more semiconductor features having one or more materials thereon. The type of substrate is not limited and may include any of the substrates suitable for semiconductor processing. The substrate processing system may include, but is not limited to, an electroplating system (ECP), a chemical vapor deposition system (CVD), a physical vapor deposition system (PVD), a substrate sputtering system, an ion implant system, an electroless plating system, a chemical mechanical planarization system (CMP), an electropolishing system, and combinations thereof.

At step 320, a noise spectrum of a process variable during substrate processing is measured. The noise spectrum can be measured and monitored in-situ while the substrate is inside the substrate processing system. The process variable may be in the form of a current, voltage, or power in order for a noise spectrum to be measured. For example, the process variable may include a substrate bias current by applying a bias power onto a substrate inside a substrate deposition chamber (e.g., chemical vapor deposition chamber or physical vapor deposition chamber, etc.), a current or voltage applied to a substrate deposition chamber for igniting a plasma therein, a current or voltage applied to an electroplating system, or a current or voltage applied to an electropolishing system, among others. The substrate processing system, which is described in detail below, includes one or more ammeters connected to at least one power source to measure the value of the process variable.

Alternatively, for measuring a noise spectrum after the substrate is processed by the substrate processing system and the metal wire structure or a metal line structure is formed at least on portions of the substrate, a test structure 200 is prepared at step 330. Then, a noise spectrum of the test structure 200 is measured at step 340.

In addition, the substrate processing system includes one or more ammeters connected to at least one power source to stress the substrate and confer at least about 1 mega-amp per square centimeter to be applied to the substrate being tested. For example, a constant current of between about 1 kilo-amps per square centimeter and about 10 million amps per square centimeter, such as about 100,000 amps per square centimeter, can be applied to the test structure 200 for measuring a noise spectrum. Alternatively, a constant voltage can be applied to the substrate being tested. Further, during stressing of the substrate with the applied voltage or current by the at least one power source, a temperature of between about 250° C. and about 350° C. can be maintained to further stress the test structure. In one embodiment, when the noise spectrum of a metal line or wire structure is monitored in-situ through monitoring a noise spectrum of a process variable, there is no additional need to stress the substrate. In another embodiment, measuring the noise spectrum of a metal line or wire structure after the substrate is processed by the substrate processing system requires a stressing step in order to collect noise power density measurements.

According to one aspect of the invention, the substrate processing system further includes a spectrum analyzer to inspect the reliability of the substrate and transform noise power density measurements through Fourier Transform algorithm into a measured noise spectrum. The spectrum analyzer may also transform the measurements of a process variable during substrate processing into a measured noise spectrum signature.

For example, the reliability of a metal film on the substrate is evaluated right before, during, or after the metal film is deposited by a thin film deposition process, such as CVD, PVD, ECP, electroless plating, or other processing steps such as plasma etching, electropolishing, and ion implantation, among others, using the substrate processing system of the invention. In another embodiment, the substrate is inspected before, during, or after thin film plating using a plasma-enhanced chemical vapor deposition system (PECVD) or an electroplating system of the invention. In an alternative embodiment, the substrate is inspected after thin film planarization or polishing using a substrate processing system of the invention, such as a electrochemical mechanical planarization (ECMP) system, available from Applied Materials, Inc., Santa Clara, Calif.

Step 350 includes comparing the noise spectrum of the one or more semiconductor structures or features to a reference noise spectrum from a noise spectrum database. The reference noise spectrum database having a number of reference noise spectra is pre-established using reliability information, preferably obtained from substrates that are processed by substantially the same substrate processing sequences or processing conditions as the substrate being tested. The noise spectrum database may also include information on electromigration (EM) tests or stress migration (SM) tests. The test results are stored, compared and correlated to various references noise spectra. At step 360, the reliability of the one or more semiconductor structures or features on the substrate is determined.

In general, the reliability of various semiconductor features and structures can be examined by electromigration (EM) testing. Typical wafer-level reliability (WLR) testing and packaged level reliability testing under high current or high temperature stressed conditions are performed using EM testing methods known in the art. An electromigration (EM) test involves measuring the resistance of a line or wire structure, stressing the line or wire structure, and comparing any change of the after-stressing resistance measurements with the resistance measurements under the pre-stressing condition. A failed or unreliable device structure means that the change of resistance is more than a pre-determined level, such as more than about 10%. The electromigration test may need to be repeated over and over, e.g., for different portions on the substrate, and usually takes days or weeks to complete. As a comparison, the method 300 of the invention is a much easier and faster way (performed in-situ or at time zero) to address the reliability issue without waiting for days or weeks.

Accordingly, the method 300 of the invention further include setting up the reference noise spectrum database in advance by obtaining the electromigration (EM) results of reference testing substrates/structures representing reliable structures and unreliable structures. The noise spectra of the predetermined reliable and unreliable reference testing substrates/structures are also measured. Then, the EM results of the reliable and unreliable structures are correlated and compared with the corresponding reference noise spectrum signatures in order to set up the reference noise spectrum database for various reliable and unreliable structures.

The method 300 of the invention is performed to determine the reliability of a metal wire structure or a metal line structure, such as copper wire structures. Performing copper wiring reliability tests using a noise spectrum is especially difficult as compared to other metal structures because of the high background noise in many advanced multi-level copper wiring structures. For example, the need in using multiple layers of barrier materials/adhesion-promoting materials, cap layers, Schottky barrier diodes, hard masks, etch stops, or anti-reflective coating layers in modern copper interconnect structures may be the source of high background noise. In addition, adhesion at the interface between layers of different materials in an copper wire structure is often problematic, resulting in stress-migration related void formation and open circuit of an IC device. In general, stress migration (SM) tests compare any change in resistance measurements of test structures before and after a high temperature baking, such as a temperature of between about 150° C. and about 300° C. A shift or migration in resistance after baking implies void formation in the test structures and open circuit when fabricated into IC device. As a comparison, performing a stress migration test on a copper wire structure usually takes about one to two weeks, however, the method 300 of the invention for determining the reliability of a copper wire structure is performed in-situ or right after the copper wire structure is formed.

Figure 4:
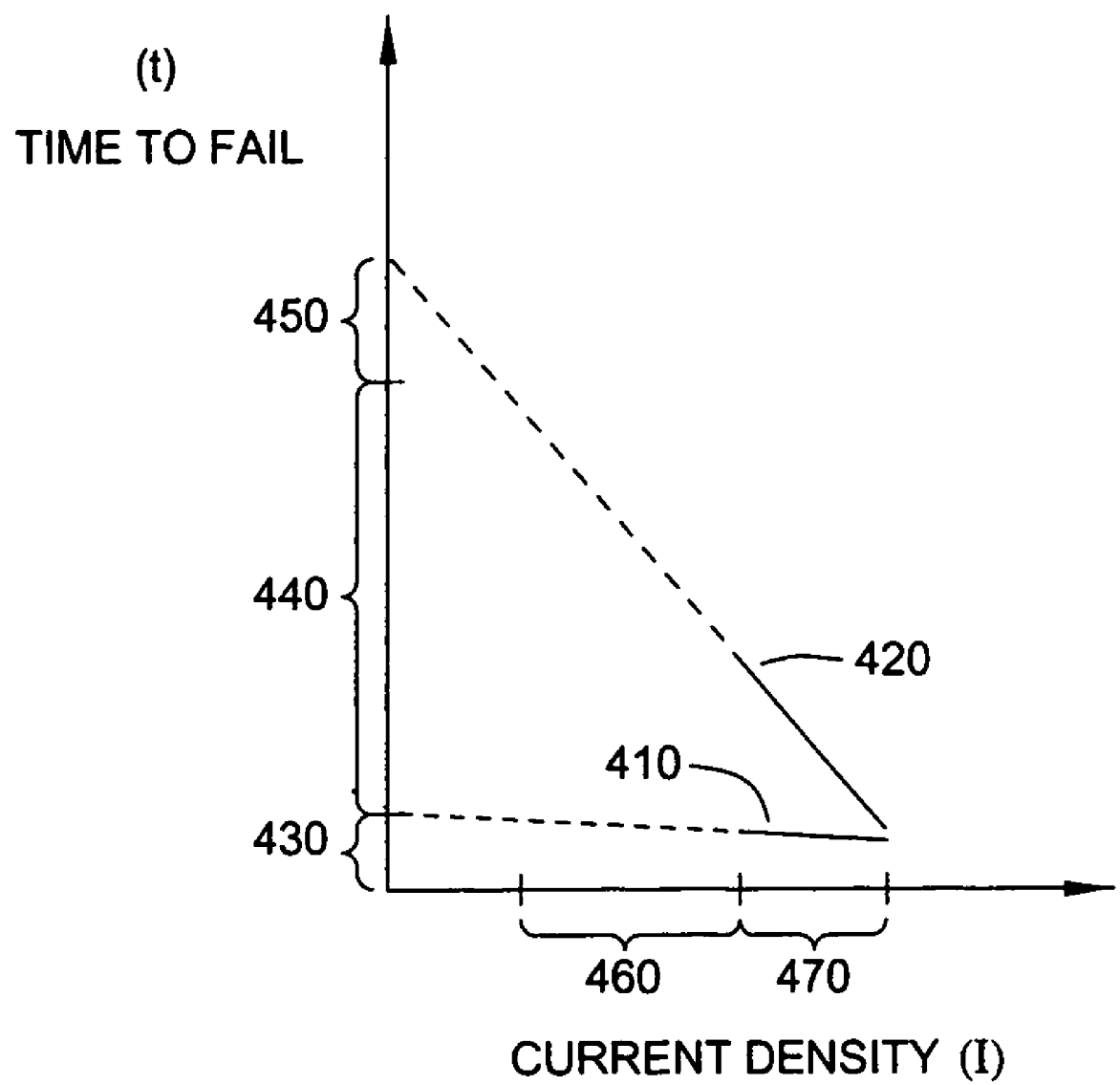
FIG. 4 is a graph demonstrating the prediction of reliable and unreliable semiconductor structures according to embodiments of the invention.

FIG. 4 demonstrates a time to fail reliability plot under a range of high current condition 470 for a reliable structure 420 and an unreliable structure 410. The plotted lines can be extrapolated down to a working current range 460 for a typical integrated circuit and reliability can be predicted by looking at the time to fail interception on the Y-axis. For example, an unreliable structure 410, having a lower Y interception value and thus an early infant mortality time period 430, can be detected. On the other hand, a reliable structure 420, for example, may have a higher Y interception value and thus a device useful duration 440 and a wear out duration 450. The reference noise spectrum database of the invention may include various noise spectrums for various semiconductor features/structures of the invention, including the unreliable structure 410 and the reliable structure 420, according to embodiments of the invention.

Figure 5A:
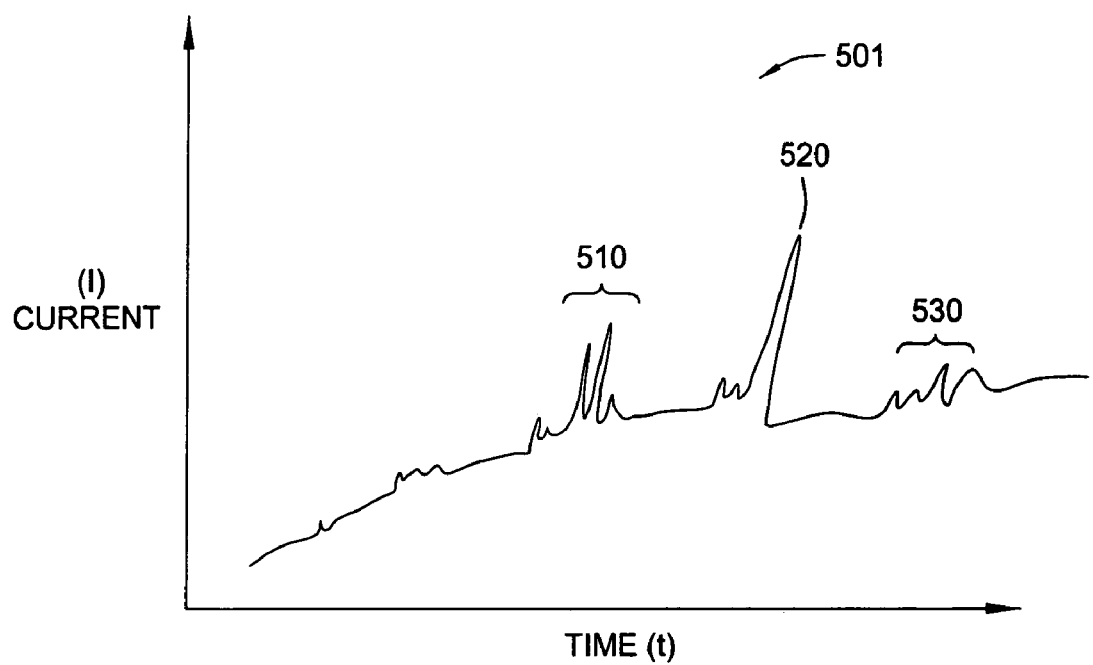
FIG. 5A demonstrates one exemplary temporal plot of current across an unreliable semiconductor feature according to one embodiment of the invention.
Figure 5B:
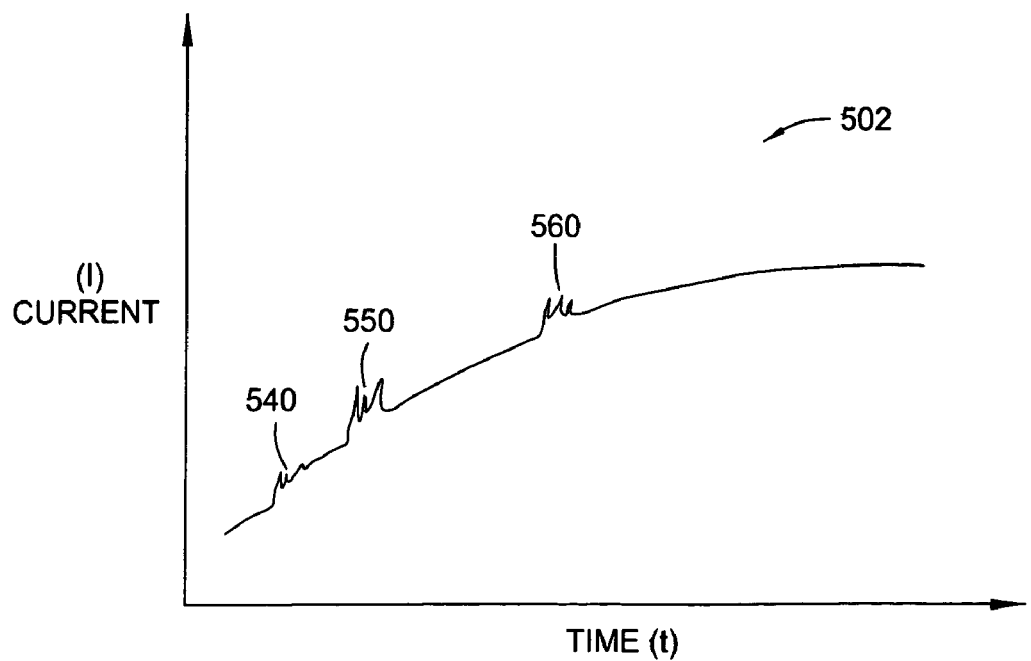
FIG. 5B demonstrates another exemplary temporal plot of current across another unreliable semiconductor feature according to another embodiment of the invention.
Figure 6A:
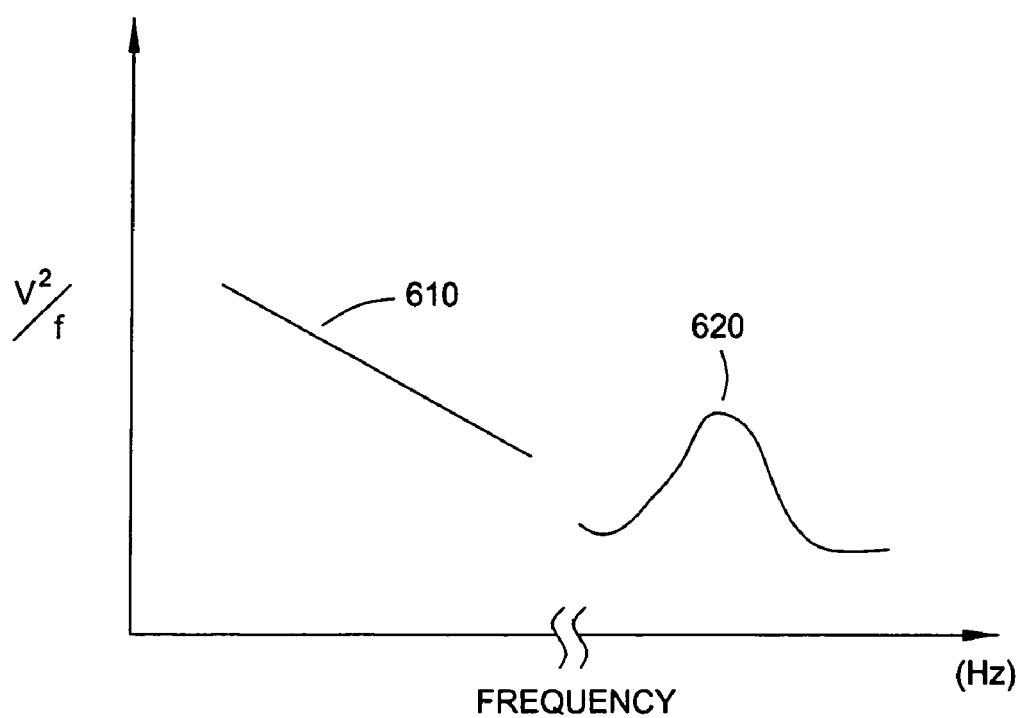
FIG. 6A demonstrates one exemplary noise spectrum of an unreliable semiconductor feature according to one embodiment of the invention.
Figure 6B:
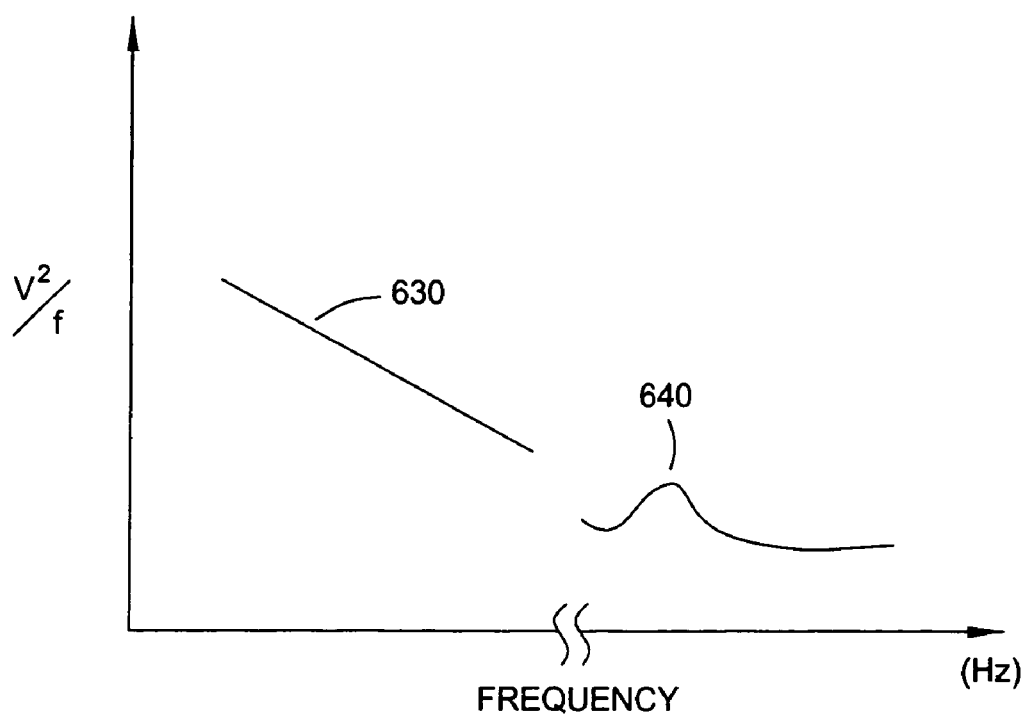
FIG. 6B demonstrates another exemplary noise spectrum of a reliable semiconductor feature according to embodiments of the invention.

For example, FIGS. 5A and 5B are temporal plots of current spikes induced for two unreliable structures 501, 502 after applying a constant DC voltage. FIG. 5A indicates the presence of current spikes 510, 520, 530, which can be detected by the substrate processing system of the invention having a spectrum analyzer and/or an ammeter. FIG. 5B indicates another unreliable structure 502 showing current spikes 540, 550, 560 when tested using the method of the invention. For any semiconductor feature/structure of the invention being tested, any spike induced is measured and transformed into a noise spectrum, such as a current noise spectrum or a voltage noise spectrum. FIGS. 6A and 6B demonstrate representative noise spectrums for an unreliable and a reliable semiconductor structure/feature, respectively, such that the reliability of these structures can be tested according to the method of the invention.

FIG. 6A illustrates a noise spectrum of a defective semiconductor structure. The X-axis is frequency and is not drawn to scale. One embodiment of the invention includes measuring the noise spectrum of a feature under a broad frequency range. As shown in FIG. 6A, the spectrum analyzer may show a straight line 610 at low frequency, however, at higher frequency, a noise curve 620 is detected for a defective semiconductor structure. As a comparison, in FIG. 6B, for a reliable semiconductor structure, there is a straight line 630 at low frequency and a small noise bump 640 at high frequency.

The frequency range of the noise spectrum used may be, for example, about 1 Hz or higher, such as from about 1 Hz to about 50 GHz, depending on the materials, the physical structure, the relationship of the various sizes of metal lines and dielectric layers, and other properties of the semiconductor structure/feature being tested. As an example, the reliability of a semiconductor feature having a size of about 10 microns or less, such as between about 0.05 microns and about 2 microns, preferably a size of about 150 nm or less, can be determined by the method and apparatus of the invention. Additionally, embodiments of the invention can be used to compare the relative reliability of various physical structures, and of any layouts.

Conventional methodologies for in-process electromicroscopy inspection of features formed on the surface of semiconductor substrates are not capable of analyzing reliability. Exemplary substrate processing systems having a monitoring/inspection module coupled thereto for determining reliability are shown in FIGS. 7-10.

Figure 7:
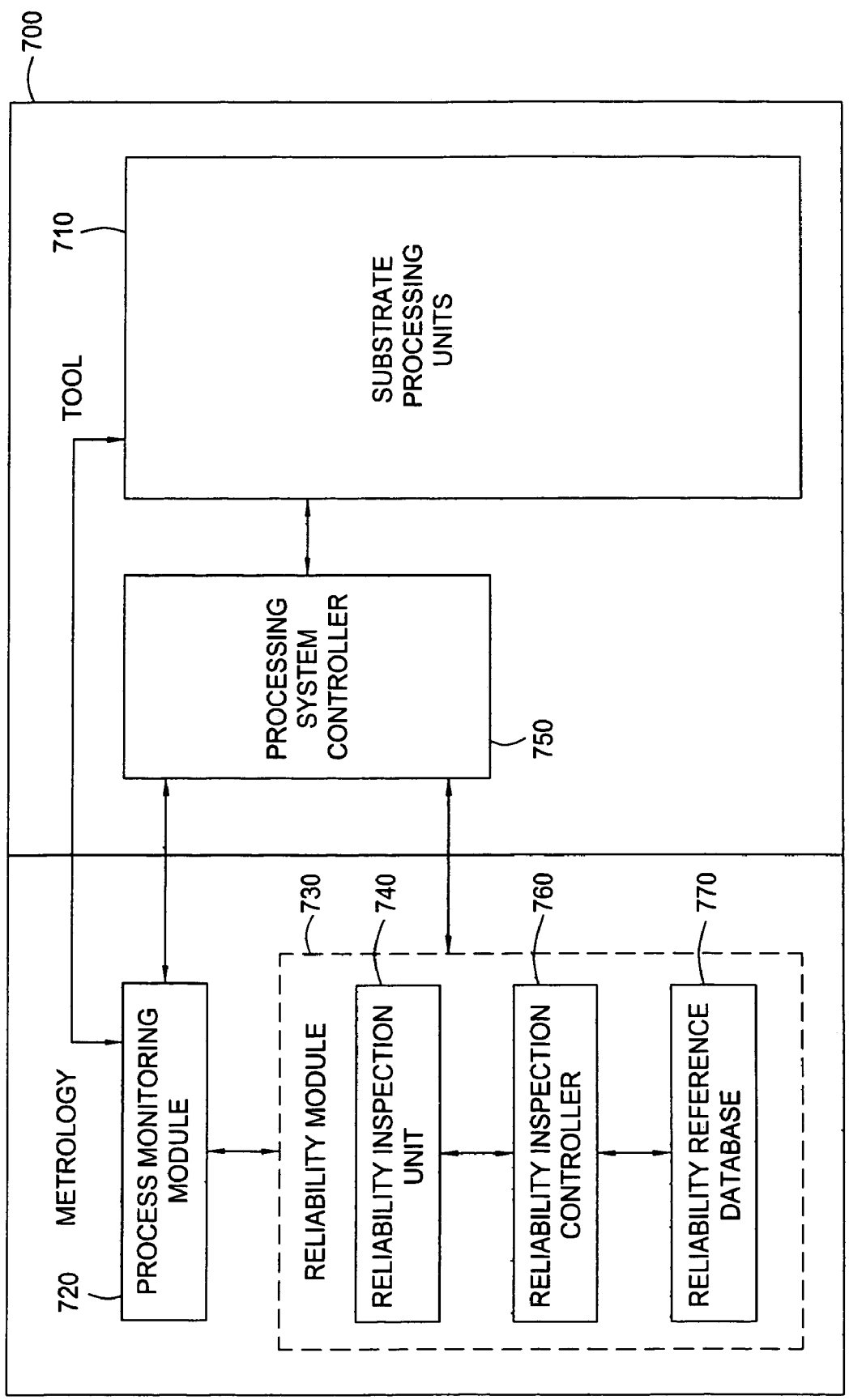
FIG. 7 depicts a perspective view of a substrate processing system having a reliability inspection module coupled thereto according to one embodiment of the invention.

FIG. 7 depicts a perspective view of a substrate processing system 700 having one or more substrate processing units 710 adapted to perform one or more substrate processes, at least one process monitoring module 720 to monitor one or more substrate processes, and at least one reliability module 730 coupled to the substrate processing units 710 and adapted to measure a noise spectrum of one or more structures/features having one or more material layers on a substrate according to embodiments of the invention. The one or one or more substrate processing units 710 may include any of the substrate processing units, processing tools, and processing cells for performing various semiconductor processing techniques, such as the substrate processing systems described in FIGS. 8-10.

One embodiment of the invention includes measuring a noise spectrum using a reliability inspection unit 740 inside the reliability module 730. For example, a noise spectrum of a feature on a substrate is measured by a spectrum analyzer and/or an ammeter inside the reliability inspection unit 740 at a predetermined frequency range, while the substrate is inside the one or more substrate processing units 710. Alternatively, a noise spectrum is measured after the substrate is processed by the one or more substrate processing units 710. The spectral signature information representing the power intensity distribution of the current or voltage noise on a substrate is obtained and stored in the reliability module 730.

Accordingly, the present invention generally provides an apparatus and a method for inspecting a substrate in a substrate processing system. In operation, a voltage source or a current source is used in conjunction with a power density receiving device, such as a spectrometer or spectrum analyzer, in the reliability inspection unit 740 to inspect a substrate for various noise spectrum signatures. In one embodiment, spectral data collected from a given substrate is used to generate a current spectral signature. The current spectral signature represents the power intensity distribution of the current noise on a substrate. This spectral density signature may then be compared to a reference spectral density signature to determine reliability of a feature structure of a substrate in processing and feedback to the substrate processing system 700 for substrate processing control, such as for processing another substrate by the substrate processing system.

As shown in FIG. 7, the reliability module 730 further includes a reliability inspection controller 760 adapted to communicate with the reliability inspection unit 740 and control the process of determining the reliability of a substrate. In one aspect, it is optimal to compare information obtained for one or more features of a substrate with a reference noise spectrum from a reliability reference database 770 in the reliability module and determine the reliability of the substrate. Preferably, the reference noise spectrum was pre-established using information measured from substrate processing of predetermined one or more features under substantially the same processing conditions as the current one or more features of the substrates, of which the reliability is to be determined.

In one embodiment, the reliability module 730 is coupled to the process monitoring module 720 and also coupled to a processing system controller 750; thus ultimately, the reliability module 730 is adapted to communicate with the one or more substrate processing units 710 in order to determine the reliability of one or more substrate processed by the one or more substrate processing units 710. An additional advantage of the invention includes the ability to predict reliability for the current batch of substrates as well as reduce defect and unreliable structure formation for the next batch of substrates by feeding back the information obtained from the reliability module 730 to the processing system controller 750 without reducing production throughput during current processing of the one or more substrates, and utilizing all the information gathered during in-process monitoring/inspection of the one or more substrates. By determining the reliability of one or more features on one or more substrates before the one or more substrates are packaged into integrated circuit devices, the invention thus provides time zero information regarding reliability characteristics of a semiconductor structure/feature on a substrate before, during, and/or after substrate processing, such as an deposition/etch, plating, and/or polishing process, among others.

In one aspect, the invention may be implemented as a computer readable medium or program-product for use with the reliability inspection controller 760, coupled to the processing system controller 750. In another aspect, the reliability information obtained is feedback to the processing system controller 750 to adjust various process parameters during substrate processing through an automated process control (APC), such as a closed-loop feedback control or an open-loop feedback control.

Further, embodiments of the invention include an apparatus and method for inspecting patterned substrates, computer-readable media containing instructions configured to control a substrate processing system, and computer program products having computer-readable program code embodied therein and adapted to control the substrate processing system, inspect defect formation, and determine reliability of a structure/feature of a substrate. Each of the controllers and computer-readable media of the invention is used to execute methods of the invention and thus display an image or a spectral signature, such as a noise spectrum signature, for each feature, each semiconductor structure, or each substrate.

In FIG. 7, each of the controllers of the substrate processing system 700 such as the process system controller 750 and the reliability inspection controller 760, may include a respective central processing unit (CPU), a memory, one or more support circuits, an input/output interface (I/O), and one or more communications buses. Each controller may be fashioned as a general-purpose computer, a workstation computer, a personal computer, a laptop computer, a microprocessor, a microcontroller, an analog computer, a digital computer, a microchip, a microcomputer, or any other known suitable type of computer. The CPU performs the processing and arithmetic operations for the substrate processing system 700. The memory includes random access memory (RAM), read only memory (ROM), removable storage, and disk drive storage that, singly or in combination, stores the computer programs, operands, operators, dimensional values, substrate process recipes and configurations, and other parameters that control the process of determining substrate reliability and the substrate processing system operation. Each communication bus provides for digital information transmissions between respective CPU, respective support circuits, respective memory, respective I/O interface, and other portions of the substrate processing system 700. A process, such as the reliability determination process described herein, is generally stored in the memory, typically as a software routine. The software routine may also be stored and/or executed by a second CPU (not shown) that is remotely located from the hardware being controlled by the CPU.

Although the process of the invention is discussed as being implemented as a software routine, some or all of the processing steps may be performed in hardware as well as by each of the software controllers. As such, the invention may be implemented in software as executed upon a computer system, in hardware as an application specific integrated circuit or other type of hardware implementation, manual implementation, or a combination of software and hardware.

Figure 8:
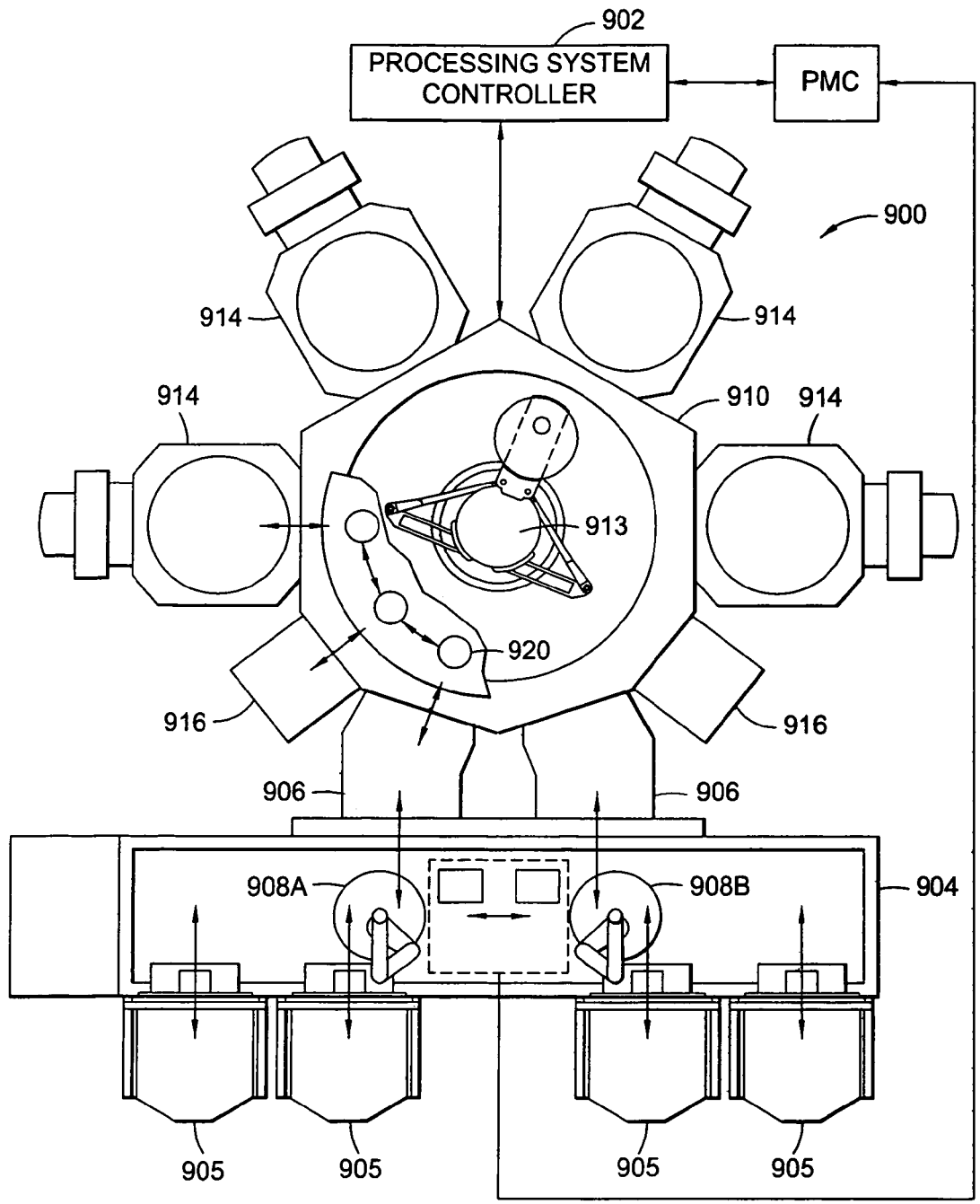
FIG. 8 illustrates a top plan view of one embodiment of a substrate processing system.

One exemplary substrate processing system of the invention is shown in FIG. 8, illustrating a plan view of a typical processing system 900 for semiconductor substrate processing wherein the present invention may be used to advantage. Two such platforms are the Centura™ and the Endura™ substrate processing systems, both available from Applied Materials, Inc., of Santa Clara, Calif. The details of one such staged-vacuum substrate processing system are disclosed in U.S. Pat. No. 5,186,718, entitled "Staged-Vacuum Wafer Processing System and Method," Tepman et al., issued on Feb. 16, 1993, which is incorporated herein by reference. The exact arrangement and combination of chambers may be altered for purposes of performing specific steps of a fabrication process.

In accordance with the present invention, the processing system 900 generally includes a plurality of chambers and robots and is preferably equipped with a processing system controller 902 programmed to carry out the various processing methods performed in the processing system 900. The processing system 900 is also connected to a reliability inspection module of the invention for determining the reliability of a feature on a substrate while the substrate is in the processing system 900 or after the substrate is processed by the processing system 900.

The processing system 900 may includes additional metrology modules connected thereto, such as a process monitoring module 720 and a reliability module 730 of the invention. A front-end environment 904 (also referred to herein as a Factory Interface or FI) is shown positioned in selective communication with a pair of load lock chambers 906. Pod loaders 908A, 908B disposed in the front-end environment 904 are capable of linear, rotational, and vertical movement to shuttle substrates between the load locks 906 and a plurality of pods 905 which are mounted on the front-end environment 904. The load locks 906 provide a first vacuum interface between the front-end environment 904 and a transfer chamber 910. Two load locks 906 are provided to increase throughput by alternatively communicating with the transfer chamber 910 and the front-end environment 904.

Thus, while one load lock 906 communicates with the transfer chamber 910, a second load lock 906 communicates with the front-end environment 904. A robot 913 is centrally disposed in the transfer chamber 910 to transfer substrates from the load locks 906 to one of the various processing chambers 914 and service chambers 916. The processing chambers 914 may perform any number of processes such as chemical vapor deposition (CVD), physical vapor deposition (PVD), electrochemical plating (ECP), chemical mechanical polishing (CMP), electropolishing, electroless deposition, other known deposition, or etching processes while the service chambers 916 are adapted for degassing, orientation, cool down and the like. A number of view ports 920 provide visual access into the transfer chamber 910.

Figure 9:
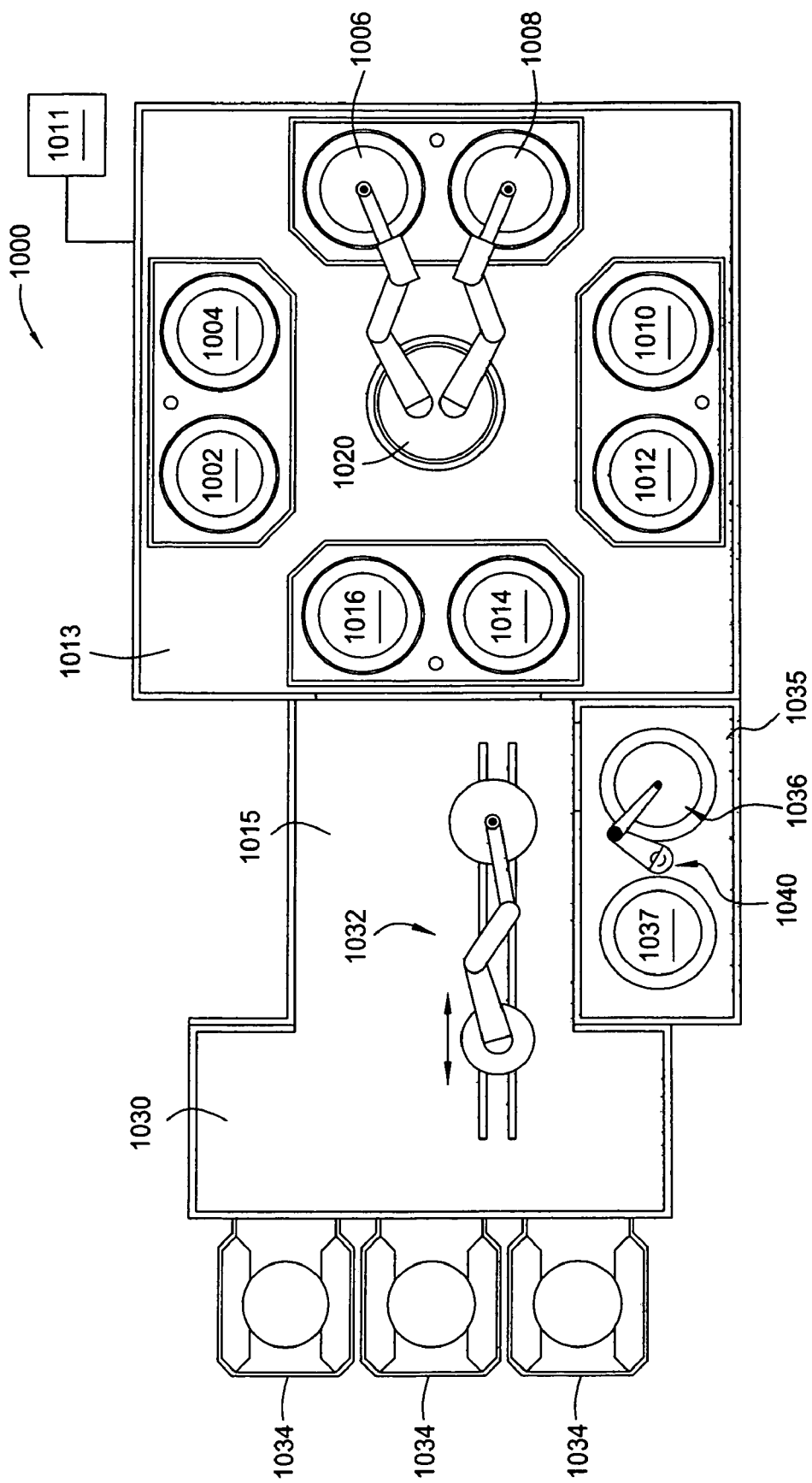
FIG. 9 illustrates a top plan view of another embodiment of a substrate processing system.

As another example, substrate processing such as metal plating can be performed within a processing cell on an Electra ECP® system or SlimCell Plating system, both of which are available from Applied Materials, Inc. of Santa Clara, Calif. FIG. 9 illustrates a top plan view of another embodiment of a SlimCell Copper Plating System.

In FIG. 9, a plating system 1000 includes a system controller 1011, a mainframe 1013, and a factory interface (FI) 1030, which is also generally termed as a substrate loading station. Factory interface 1030 includes a plurality of substrate loading stations configured to interface with substrate containing cassettes 1034. A robot 1032 is positioned in factory interface, 1030 and is configured to access substrates contained in the cassettes 1034. Further, robot 1032 also extends into a link tunnel 1015 that connects factory interface 1030 to the processing mainframe or platform 1013. The position of the robot 1032 allows the robot 1032 to access substrate cassettes 1034 to retrieve substrates therefrom and then deliver the substrates to one of the processing cells 1014, 1016 and also to other processing cells, 1002, 1004, 1006, 1008, 1010, 1012 through a mainframe robot 1020 positioned on the mainframe 1013, or alternatively, to an annealing station 1035. The annealing station 1035 may include two chambers 1036, 1037 and a robot 1040. Similarly, the robot 1032 may be used to retrieve substrates from the processing cells 1014, 1016 or the annealing station 1035 after a substrate processing sequence is complete. In this situation, the robot 1032 may deliver the substrate back to one of the cassettes 1034 for removal from the plating system 1000.

During metal plating operation, such as plating a copper material on a substrate, the current and voltage of the ECP system 1000 is measured and monitored by the system controller 1011 or a metrology process control module. Such plating current and voltage is also transformed into a noise spectrum, such as an electroplating current spectrum, a current noise spectrum, or a voltage noise spectrum. A reliability inspection module is connected to the ECP system 1000 to accordingly transform the noise spectrum of a substrate having one or more features thereon before, during, or after a metal plating process. Next, according to one aspect of the invention, the determined electroplating current spectrum of one or more features on a substrate as is compared to a reference electroplating current spectrum stored in a reference electroplating current spectrum database and the reliability of the one or more features on the substrate is determined.

Figure 10:
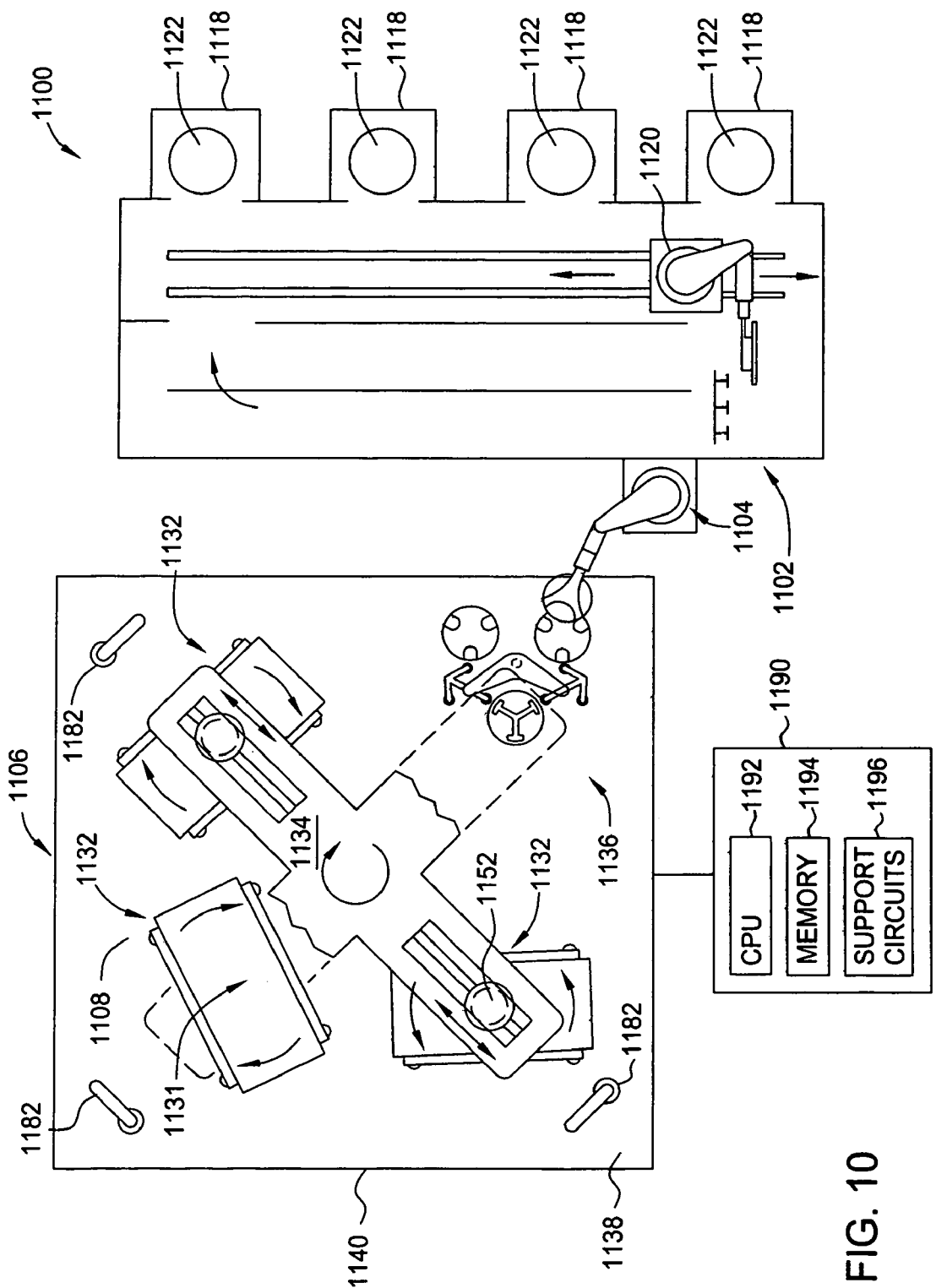
FIG. 10 illustrates a top plan view of yet another embodiment of a substrate processing system.

As yet another example, FIG. 10 illustrates a top plan view of another substrate processing system, such as a chemical mechanical planarization (CMP) system 1100, which can be connected to a reliability inspection module of the invention for determining the reliability of a feature on a substrate while the substrate is in the CMP system 1100. A CMP system whether including a stationary, rotatable, or linear platen may be utilized to practice the methods described herein. For simplicity and ease of description, however, the invention will be further described with reference to a Reflexion® CMP System, available from Applied Materials, Inc., of Santa Clara, Calif.

FIG. 10 illustrates a perspective view of the Reflexion® CMP System 1100. Generally, the CMP system 1100 includes a factory interface 1102, a loading robot 1104, one or more polishing modules 1106, and one or more lift assemblies 1108. The loading robot 1104 is disposed proximate the factory interface 1102 and the polishing module 1106 to facilitate the transfer of substrates 1122 therebetween. The substrate 1122 may be stored in one or more loading stations 1118 and retrieved by a robot 1120. Alternatively, the polishing module 1106 may be a Mirra® Chemical Mechanical Polisher, available from Applied Materials, Inc. Other polishing modules 1106 including those having polishing media, polishing webs, and combinations thereof may also be used. The polishing module 1106 includes a plurality of polishing stations 1132, a carousel 1134 disposed on an upper or first side 1138 of a machine base 1140, and a transfer station 1136. The polishing module 1106 also includes a conditioning device 1182 disposed on the machine base 1140 adjacent each polishing station 1132. The conditioning device 1182 periodically conditions polishing surfaces 1131 of the polishing stations 1132 to maintain uniform polishing results.

At each polishing station 1132, a polishing media or a polishing pad, such as a rectangular web of polishing material or a round polishing surface is disposed on each polishing surface 1131 between a polishing head assembly 1152 and the polishing station 1132. The polishing pad may include abrasive sheet polishing media containing abrasive particles. The polishing pad may also be conventional polishing pad made of polyurethane without containing abrasive particles. The polishing pads are typically disposed on binders or subpads, which act as backing supports. The polishing pad may have a smooth surface, a textured surface, a surface containing an abrasive in a binder material, or a combination thereof. The web of polishing material may be in the form of a roll or sheet (e.g., pad) of material that may be advanced across or releasably fixed to the polishing surface by a polishing material retention system that utilizes adhesives, vacuum, mechanical clamps, bonding, electrostatic chucks, or other retention mechanism.

In addition, the polishing pad may also be polishing media containing conductive materials for electropolishing or electrochemical mechanical planarization processes. Accordingly, a process variable such as a current or voltage applied to the substrate being polished is monitored, transformed into a noise spectral signature, and compared with a reference noise spectrum.

The polishing station 1132 generally includes a polishing platen that is disposed on a base. The polishing platen is typically made of aluminum and is supported above the base by a bearing so that the polishing platen may rotate in relation to the base. The polishing platen has a top portion that supports the web of polishing material. The top portion may optionally include a plurality of passages coupled to a fluid source. Fluid flowing through the passages may be used to control the temperature of the polishing platen and the polishing material disposed thereon.

In one embodiment, the polishing head is a TITAN HEAD™ substrate carrier manufactured by Applied Materials, Inc., Santa Clara, Calif. Generally, there is a retaining ring circumscribing the polishing head to retain the substrate within the polishing head while polishing. To facilitate control of the CMP system as described herein, a system controller 1190 may be used. The controller 1190 may include a CPU 1192, a memory 1194, and a support circuit 1196. The controller 1190 may further connect to the process monitoring module 720 and the reliability module 730 of the invention.

Accordingly, the invention provides an apparatus and method for generating real-time information about selected characteristics of a substrate. Substrate inspection is preferably performed before, during, and after processing. Referred back to FIG. 7, a preferred operation of the invention may be understood as follows. Optical inspection of substrates may be initially accomplished by the process monitoring module 720 located in the Factory Interface. Thus, substrates can be analyzed prior to entry into the processing system vacuum environment where process chambers or service chambers are located. Upon transfer of a substrate from the transfer chamber into a process chamber or service chamber by a robot, embodiments of the invention preferably operate to scan the substrate or otherwise capture a noise spectrum of a portion, or all, of the substrate by installing pad structures 250, 260 of FIG. 2 on a portion or all of the substrate having one or more features. During substrate processing, a noise spectrum of a process variable can be measured and monitored. After substrate processing, a noise spectrum of the substrate having various semiconductor structures formed thereon may again be scanned after the retraction of the substrate from the processing or service chamber by installing pad structures 250, 260 of FIG. 2 on the newly processed/formed semiconductor structures. Additionally, a determination may be made regarding the reliability of the one or more features due to any specific substrate processing sequence. For example, the collected substrate noise spectrum signatures may be used to generate information on process uniformity and confirm process endpoint for processing reliable metal wire features. Accordingly, the reliability of the one or more features on the substrate can be continually monitored at various stations in the substrate processing system of the invention.

While the foregoing is directed to embodiments of the present invention, other and further embodiments of the invention may be devised without departing from the basic scope thereof, and the scope thereof is determined by the claims that follow.

The invention claimed is:

1. A method for determining the reliability of one or more features having one or more metal materials formed on a substrate, comprising:
    placing the substrate in a substrate processing system;
    measuring a noise spectrum of a process variable affecting the processing of the substrate while the substrate is inside the substrate processing system;
    comparing the noise spectrum of the process variable for the one or more features having the one or more metal materials thereon to a reference noise spectrum; and
    determining the reliability of the one or more features on the substrate.

2. The method of claim 1, wherein the one or more features is a semiconductor feature selected from the group consisting of via, line, wire, plug, contact, trench, interconnect structure, and combinations thereof.

3. The method of claim 1, wherein the one or more metal materials are selected from the group consisting of copper, tungsten, aluminum, their alloys, and combinations thereof.

4. The method of claim 1, wherein the substrate processing system is selected from the group consisting of chemical vapor deposition system, physical vapor deposition system, electroplating system, chemical mechanical planarization system, electropolishing system, and combinations thereof.

5. The method of claim 1, wherein the noise spectrum is selected from the group consisting of a current noise spectrum, a voltage noise spectrum, and combinations thereof.

6. The method of claim 1, wherein the reference noise spectrum is stored in a reference noise spectrum database comprising information related to electromigration characteristics of a reference feature processed by the substrate processing system under substantially the same conditions.

7. The method of claim 1, wherein the reliability of the one or more features is determined before the substrate is packaged.

8. The method of claim 1, further comprising feeding back the information on the determined reliability of the one or more features to the substrate processing system such that processing of another substrate by the substrate processing system is adjusted.

9. The method of claim 1, wherein the process variable comprises a variable measured during substrate processing selected from a group consisting of a bias applied to the substrate, a plasma applied to the substrate processing system, a current applied to the substrate processing system, an electroplating current, and combinations thereof.

10. A method for determining the reliability of one or more features having one or more metal materials formed on a substrate, comprising:
placing the substrate in an electroplating processing system;
measuring an electroplating current noise spectrum of the one or more features while the substrate is inside the electroplating processing system;
comparing the electroplating current noise spectrum of the one or more features having the one or more metal materials thereon to a reference electroplating current noise spectrum; and
determining the reliability of the one or more features on the substrate.

11. The method of claim 10, wherein the one or more features is a semiconductor feature selected from the group consisting of via, line, wire, plug, contact, trench, interconnect structure, and combinations thereof.

12. The method of claim 10, wherein the one or more metal materials comprises copper.

13. The method of claim 10, wherein the reference electroplating current noise spectrum is stored in a reference electroplating current noise spectrum database comprising information related to electromigration characteristics of a reference feature processed by the electroplating processing system under substantially the same conditions.

14. The method of claim 10, further comprising feeding back the information on the determined reliability of the one or more features to the electroplating processing system such that processing of another substrate by the electroplating processing system is adjusted.

15. A computer-readable medium for determining the reliability of one or more features having one or more materials formed on a substrate, comprising:
instructions configured to control a substrate processing system, inspect the substrate processed by the substrate processing system, and perform one or more steps, comprising:
measuring a noise spectrum of a process variable affecting the processing of the substrate;
comparing the noise spectrum of the process variable for the one or more features having the one or more metal materials thereon to a reference noise spectrum; and
determining the reliability of the one or more features on the substrate based on the comparison.

16. The computer-readable medium of claim 15, wherein measuring the noise spectrum comprises measuring the noise spectrum of the process variable while the substrate is being processed inside the substrate processing system.

17. The computer-readable medium of claim 15, wherein the noise spectrum is measured after the substrate is processed by the substrate processing system and before the substrate is packaged into integrated circuit devices.

18. The computer-readable medium of claim 15, wherein the one or more features is a semiconductor feature selected from the group consisting of via, line, wire, plug, contact, trench, interconnect structure, and combinations thereof.

19. The computer-readable medium of claim 15, wherein the one or more materials are selected from the group consisting of metal, copper, tungsten, aluminum, their alloys, and combinations thereof.

20. The computer-readable medium of claim 15, wherein the substrate processing system is selected from the group consisting of chemical vapor deposition system, physical vapor deposition system, electroplating system, chemical mechanical planarization system, electropolishing system, and combinations thereof.

21. The computer-readable medium of claim 15, wherein the noise spectrum is selected from the group consisting of a current noise spectrum, a voltage noise spectrum, and combinations thereof.

22. The computer-readable medium of claim 15, wherein the reference noise spectrum is stored in a reference noise spectrum database comprising information related to electromigration characteristics of a reference feature processed by the substrate processing system under substantially the same conditions.

23. The computer-readable medium of claim 15, wherein the one or more steps further comprises feeding back the information on the determined reliability of the one or more features to the substrate processing system such that processing of another substrate by the substrate processing system is adjusted.

* * * * *